United States Patent [19]
Noble, Jr. et al.

[11] Patent Number: 6,128,216
[45] Date of Patent: Oct. 3, 2000

[54] HIGH DENSITY PLANAR SRAM CELL WITH MERGED TRANSISTORS

[75] Inventors: Wendell P. Noble, Jr., Milton, Vt.; Leonard Forbes, Corvallis, Oreg.

[73] Assignee: Micron Technology Inc., Boise, Id.

[21] Appl. No.: 09/076,766

[22] Filed: May 13, 1998

[51] Int. Cl.[7] .................... G11C 11/00; G11C 11/36
[52] U.S. Cl. .................... 365/154; 365/156; 365/175
[58] Field of Search .................... 365/175, 180, 365/181, 154, 156

[56] References Cited

U.S. PATENT DOCUMENTS

| | | | |
|---|---|---|---|
| 3,729,719 | 4/1973 | Wiedmann | 365/180 |
| 4,654,824 | 3/1987 | Thomas et al. | 365/175 |
| 4,912,675 | 3/1990 | Blake et al. | 365/154 |
| 5,173,754 | 12/1992 | Manning | 357/23.7 |
| 5,214,295 | 5/1993 | Manning | 257/67 |
| 5,276,638 | 1/1994 | Wong | 365/156 |
| 5,286,663 | 2/1994 | Manning | 437/41 |
| 5,486,717 | 1/1996 | Kokubo et al. | 257/385 |
| 5,497,011 | 3/1996 | Terashima | 257/147 |
| 5,535,156 | 7/1996 | Levy et al. | 365/175 |
| 5,581,104 | 12/1996 | Lowrey et al. | 257/355 |
| 5,594,683 | 1/1997 | Chen et al. | 365/177 |
| 5,624,863 | 4/1997 | Helm et al. | 438/210 |
| 5,650,350 | 7/1997 | Dennison et al. | 437/52 |
| 5,705,843 | 1/1998 | Roberts | 257/379 |
| 5,710,741 | 1/1998 | McLaury | 365/226 |

OTHER PUBLICATIONS

R. C. Fang, Latchup Model for the Parasitic P–N–P–N Path in Bulk CMOS, IEEE Transactions on Electron Devices, vol. Ed. 31, No. 1, Jan. 1984.

R. R. Troutman et al, Transient Analysis of Latchup in Bulk CMOS, IEEE Transactions on Electron Devices, vol. Ed. 30, No. 2, Feb. 1993.

D. L. Hetherington et al, An Intergrated GaAs N–P–N–P Thyristor/JFET Memory Cell Exhibiting Nondestructive Read, IEEE Electron Device Letters, vol. 13, No. 9, Sep. 1992.

S. V. Vandebroek et al, High–Gain Lateral Bipolar Action in a MOSFET Structure, IEEE Transactions on Electron Devices, vol. 38, No. 11, Nov. 1991.

Dermot MacSweeney et al., Modeling of Lateral Bipolar Devices in a CMOS, IEEE BCTM 1.4, 4 pages.

J.J. Ebers, Four–Terminal P–N–P–N Transistors, Proceedings of IRE, Nov. 1952, p. 1361–4.

I.T. Ho et al, Single Thyristor Static Memory and its fabrication, vol. 23, No. 3, 1980.

B.L. Gregory et al, Latchup in CMOS integrated circuits, Sandia Laboratories, p. 12–18.

S. M. Sze, Physics of Semiconductor Devices, Second Edition, A Wiley Interscience Pub.

S.D. Malaviya, Single–Device DC Stable Memory Cell, IBM Technical Disclosure Bulletin, vol. 20, No. 9, pp 3492–94, Nov. 1978.

Farid Nemati et al, "A Novel High Density, Low Voltge SRAM Cell with a Vertical NDR Device", Center for Integrated Systems, Stanford University, Stanford, CA, (2 pages), published in IEEE 1998, Symposium on VLSI Technology, Honolulu, Hawaii, Jun. 9th and 11th, 1998.

Hyun–Jin Cho et al, "A Novel Pillar DRAM Cell for 4GBIT and Beyond", Center for Integrated Systems, Stanford University, Stanford, CA, (2 pages), published in IEEE 1998, Symposium on VLSI Technology, Honolulu, Hawaii, Jun. 9th and 11th, 1998.

*Primary Examiner*—Son Mai
*Attorney, Agent, or Firm*—Dickstein Shapiro Morin & Oshinsky LLP

[57] ABSTRACT

Area efficient static memory cells and arrays containing p-n-p-n or n-p-n-p transistors which can be latched-up in a bistable on state. Each transistor memory cell includes gates which are pulse biased during the write operation to latch-up the cell. Also provided are linked memory cells in which the transistors share common regions.

51 Claims, 12 Drawing Sheets

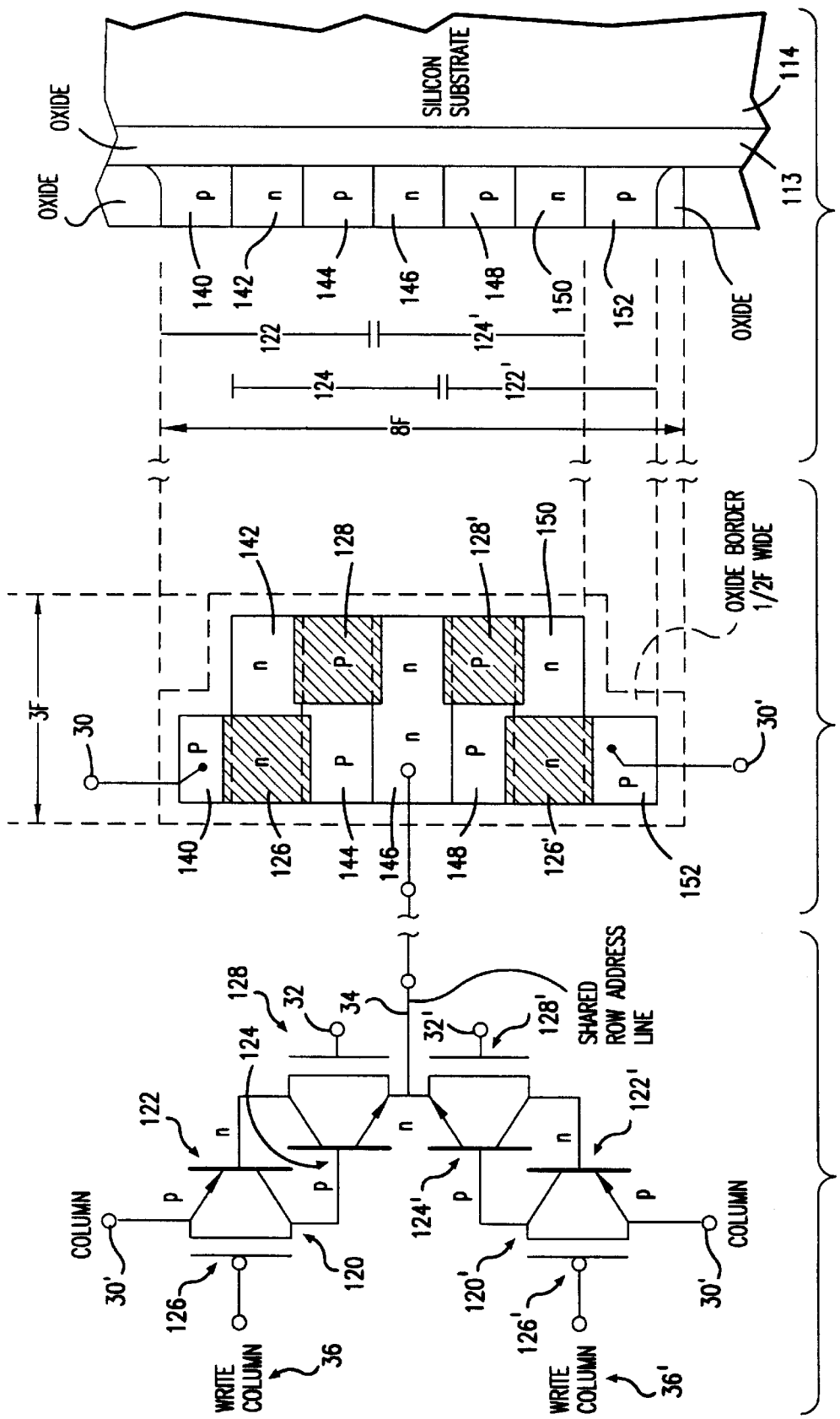

HIGH DENSITY PLANAR SRAM CELL WITH MERGED TRANSISTORS

FIELD OF THE INVENTION

This invention relates generally to static memory devices. Particularly, this invention relates to a high density Static Random-Access Memory (SRAM) cell taking advantage of the latch-up phenomenon in a Complementary Metal Oxide Semiconductor (CMOS).

BACKGROUND OF THE INVENTION

There are two major types of random-access memory cells, dynamic and static. Dynamic random-access memories (DRAMs) can be programmed to store a voltage which represents one of two binary values, but require periodic reprogramming or "refreshing" to maintain this voltage for more than very short time periods. Static random-access memories (SRAMs) are so named because they do not require periodic refreshing.

SRAMs are bistable, meaning that they have two stable or self-maintaining operating states, corresponding to different output voltages. Each operating state defines one of the two possible binary bit values, zero or one. A static memory cell typically has an output which reflects the operating state of the memory cell. Such an output produces a "high" voltage to indicate a "set" operating state, usually representing a binary value of one, and produces a "low" voltage to indicate a "reset" operating state, which usually represents a zero. Without external stimuli, a static memory cell will operate continuously in a single one of its two operating states. It has internal feedback mechanisms that maintain a stable output voltage, corresponding to the operating state of the memory cell, as long as the memory cell receives power.

The operation of a static memory cell is in contrast to other types of memory cells such as dynamic cells which do not have stable operating states. A dynamic memory cell requires periodic refreshing to maintain storage of a voltage for more than very short time periods, because it has no internal feedback to maintain a stable output voltage. Without refreshing, the output of a dynamic memory cell will drift toward intermediate or indeterminate voltages, resulting in loss of data. Dynamic memory cells are used in spite of this limitation because of the significantly greater packaging densities which can be attained. For instance, a dynamic memory cell can be fabricated with a single MOSFET transistor, rather than the six transistors typically required in a static memory cell.

Conventional CMOS SRAM cells essentially consist of a pair of cross-coupled inverters as the storage flip-flop or latch, and a pair of pass transistors as the access devices for data transfer into and out of the cell. Thus, a total of six Metal Oxide Semiconductor Field Effect Transistors (MOSFETs), or four MOSFETs plus two very high resistance load devices, are required for implementing a conventional CMOS SRAM cell. The large number of devices required for each CMOS SRAM cell results in exceptionally large cell areas, typically over 100 $F^2$, where F is the minimum feature size. Even using only n-channel devices, cell size in a compact SRAM design is commonly over 50 $F^2$. See U.S. Pat. No. 5,486,717. The result is much lower densities than for DRAMs, where the cell size is only 6 or 8 $F^2$.

To achieve higher packing densities, several methods are known for reducing the number of devices needed for CMOS SRAM cell implementation, or the number of the devices needed for performing the Read and Write operations. However, increased process complexity, extra masks, and high fabrication cost are required and the corresponding product yield is not high.

For example, K. Sakui, et al., "A new static memory cell based on reverse base current (RBC) effect of bipolar transistor," IEEE *IEDM Tech. Dig.*, pp. 44–47, December 1988), refers to a Bipolar-CMOS (BICMOS) process in which only two devices are needed for a SRAM cell: one vertical bipolar transistor, and one MOSFET as a pass device. Extra processing steps and increased masks are required, along with special deep isolation techniques, resulting in high fabrication cost and process complexity. Yield of SRAM products utilizing such complex processes is usually low compared with the existing CMOS processes.

A problem with CMOS circuits in general is their propensity to "latch-up." Latch-up is a phenomenon that establishes a very low-resistance path between the $V_{DD}$ and $V_{SS}$ power lines, allowing large currents to flow through the circuit. This can cause the circuit to cease functioning, or even to destroy itself due to heat damage caused by high power dissipation.

The susceptibility to latch-up arises from the presence of complementary parasitic bipolar transistor structures, which result from the fabrication of the complementary MOS devices in CMOS structures. Because they are in close proximity to one another, the complementary bipolar structures can interact electrically to form device structures which behave like p-n-p-n diodes. In the absence of triggering currents, such diodes act as reverse-biased junctions and do not conduct. Such triggering currents, however, may be and in practice are established in any one or more of a variety of ways, e.g., terminal overvoltage stress, transient displacement currents, ionizing radiation, or impact ionization by hot electrons.

Gregory, B. L., et al., "Latch-up in CMOS integrated circuits," *IEEE Trans. Nucl. Sci. (USA)*, Vol. 20, no. 6, p. 293–9, proposes several techniques designed to eliminate latch-up in future CMOS applications. Other authors, such as Fang, R. C., et al., "Latch-up model for the parasitic p-n-p-n path in bulk CMOS," *IEEE Transactions on Electron Devices*, Vol. ED-31, no. 1, pp. 113–20, provide models of the latch-up phenomenon in CMOS circuits in an effort to facilitate design optimizations avoiding latch-up.

The present invention takes advantage of the normally undesirable latch-up phenomenon in CMOS circuits to construct a compact static memory cell.

SUMMARY OF THE INVENTION

The present invention provides area efficient static memory cells and memory arrays by the use of parasitic bipolar transistors which can be latched in a bistable on state with small area transistors. Each bipolar transistor memory cell includes two gates which are pulse biased during the write operation to latch-up the cell. These cells can be realized utilizing CMOS technology to create planar structures with a minimum of masking steps and minimal process complexity.

Advantages and features of the present invention will be apparent from the following detailed description and drawings which illustrate preferred embodiments of the invention.

BRIEF DESCRIPTION OF THE DRAWINGS

FIG. 12 is a circuit diagram illustrating a second embodiment of a SRAM cell with latch-up and two gated lateral bipolar transistors, and a shared row address line according to the present invention;

FIG. 13 is a schematic diagram illustrating the regions and features of the SRAM cell of FIG. 12;

FIG. 14 is a cross-sectional view of the SRAM cell of FIG. 12 illustrating the regions and junctions;

DETAILED DESCRIPTION OF THE PREFERRED EMBODIMENT

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms wafer or substrate used in the following description include any semiconductor-based structure having an exposed silicon surface in which to form the structure of this invention. Wafer and substrate are to be understood as including silicon-on-insulator, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation. The following detailed description is, therefore, not to be taken in a limiting sense, and the scope of the present invention is defined by the appended claims.

Figure 1:
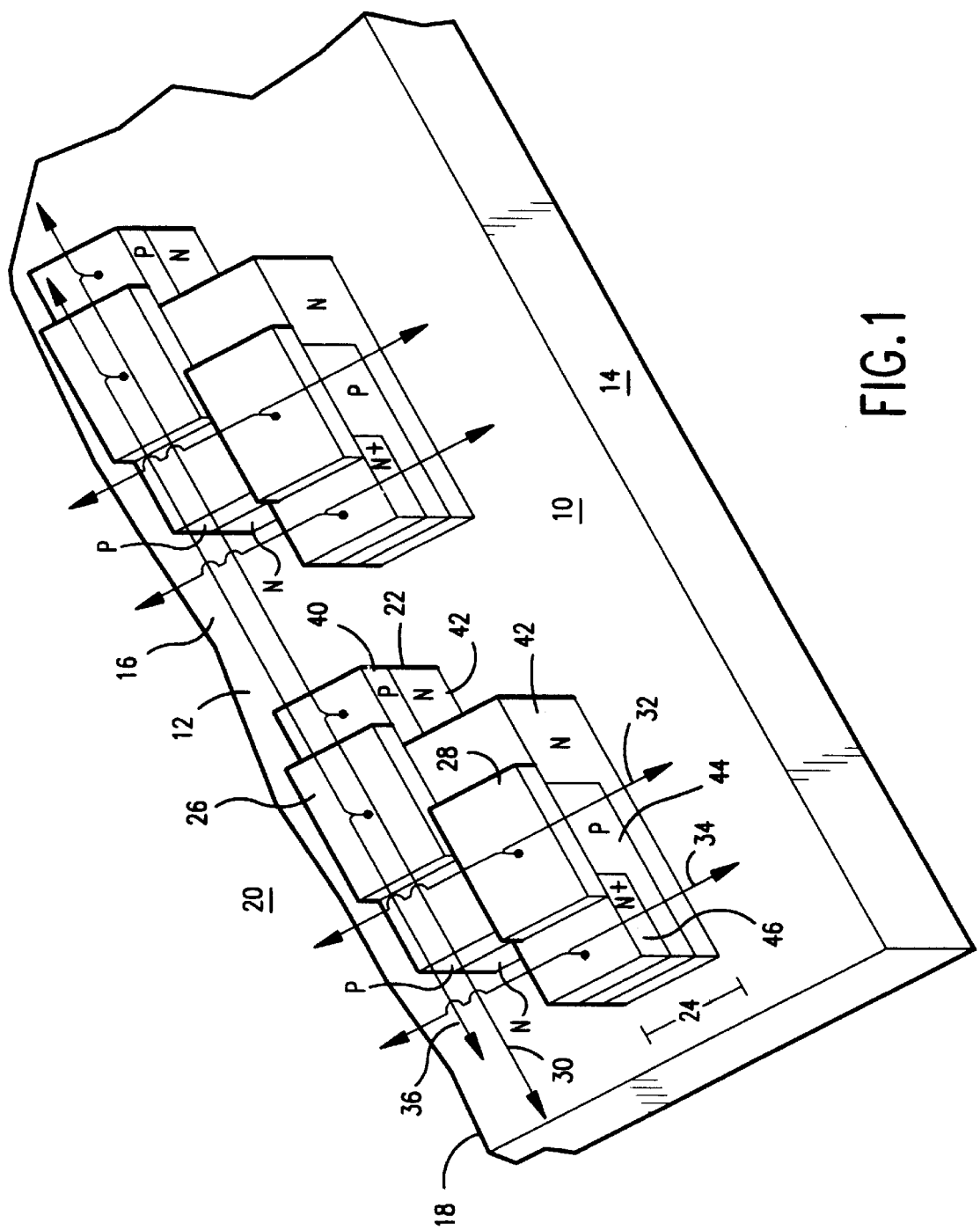
FIG. 1 is a perspective view of an SRAM cell array constructed in accordance with one embodiment of the present invention.

Referring now to the drawings, where like elements are designated by like reference numerals, an embodiment of the SRAM device array 10 of the present invention is shown in FIG. 1. The array 10 is comprised of a plurality of planar parasitic bipolar transistor pairs on p-type silicon substrate 14. Planar transistor pairs or devices, noted generally 12, are separated from each other by isolation trenches 16, 18. Each parasitic bipolar transistor device 12 has dimensions of two F by four F, and each isolation trench 16, 18 is preferably one F wide. Thus, with the inclusion of transistor to transistor isolation, the area per programmed device cell is approximately 13 $F^2$ [(3 F×5 F)–2 $F^2$ unused space].

Referring to FIG. 1, a dual transistor memory cell, generally designated 20, comprises two complementary bipolar transistors 22, 24, each of which is overlain by a polysilicon gate 26, 28. Each memory cell 20 is connected to other memory cells via four sets of interconnects. Column address line 30 is connected to the emitter of transistor 22, gate line 36 is connected to the gate 26 of transistor 22, row address line 34 is connected to the emitter of transistor 24, and gate line 32 is connected to the gate 28 of transistor 24.

Figure 2:
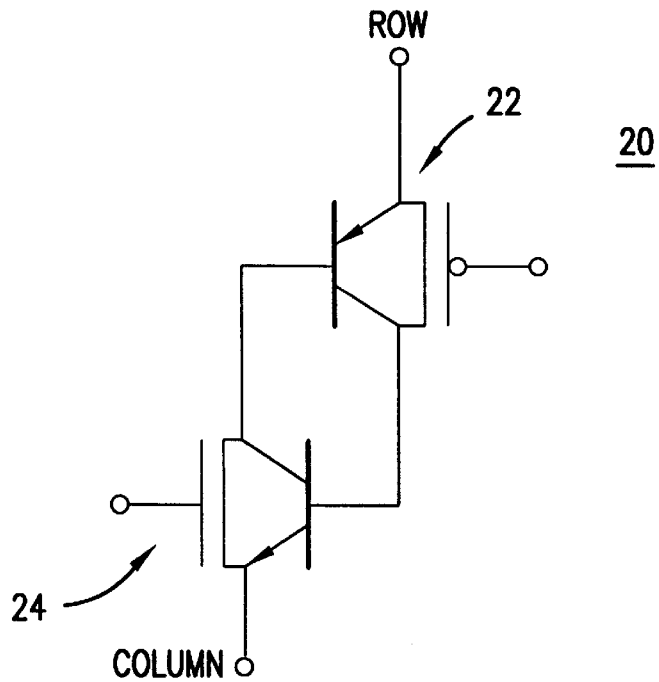
FIG. 2 is a circuit diagram illustrating one embodiment of a SRAM cell with latch-up and two gated lateral bipolar transistors according to the present invention.

As shown in FIGS. 2 through 5, p+ region 40, n-region 42, and p-region 44 comprise a lateral p-n-p bipolar transistor 22; and n+ region 46, p-region 44, and n-region 42 comprise a lateral n-p-n bipolar transistor 24. N-region 42 undercuts p+ region 40 and p-region 44, and is preferably formed as a retrograde n-well, meaning that the dopant is graded in the vertical direction with higher concentrations at the bottom of the well. The transistors 22, 24 are connected so that the collector of transistor 22 is connected to the base of transistor 24, and vice-versa, as shown in FIGS. 1 and 2.

Figure 3:
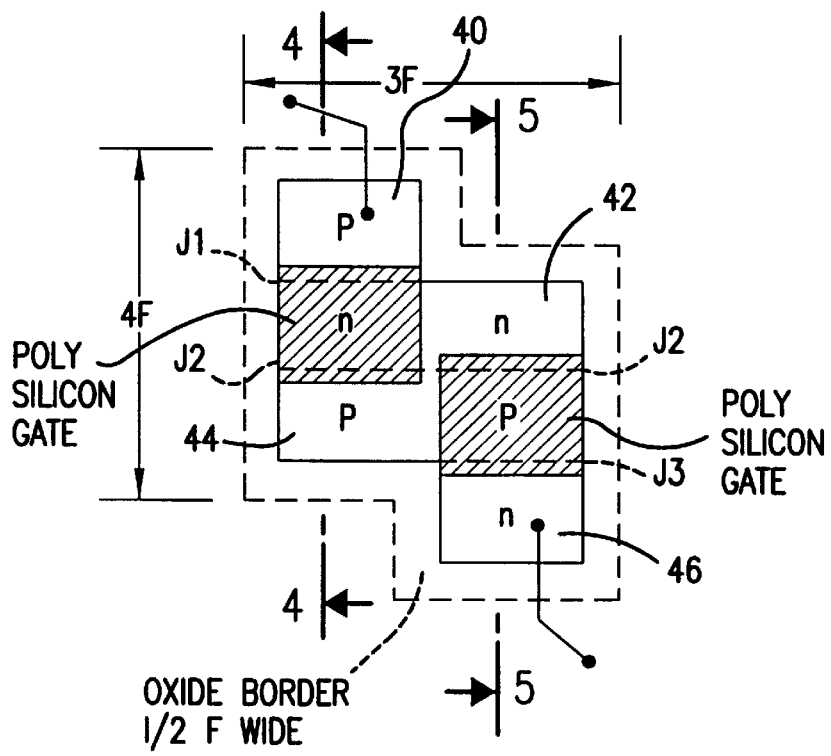
FIG. 3 is a schematic diagram illustrating the regions and junctions of the SRAM cell of FIG. 2.

Referring to FIG. 3, the interface between p+ region 40 and n-region 42 comprises a first junction J1, the interface between n-region 42 and p-region 44 comprises a second junction J2, and the interface between p-region 44 and n+ region 46 comprises a third junction J3. The four regions, i.e., p+ region 40, n– region 42, p-region 44 and n+ region 46, constitute a four-layer diode (also called a Shockley diode) as is known in the art. See Malvino, Albert Paul, "Electronic Principles" $2^{nd}$ Ed., 560–561 (McGraw-Hill, Inc. eds., 1979). The second junction J2 acts as a collector of holes from the first junction J1 and of electrons from the third junction J3. At equilibrium there is a depletion region at each junction, with a built-in potential determined by the impurity doping profile. When a positive voltage is applied to the anode 40, the second junction J2 will become reverse-biased, while the first and third junctions J1, J3 will be forward-biased.

Figure 4:
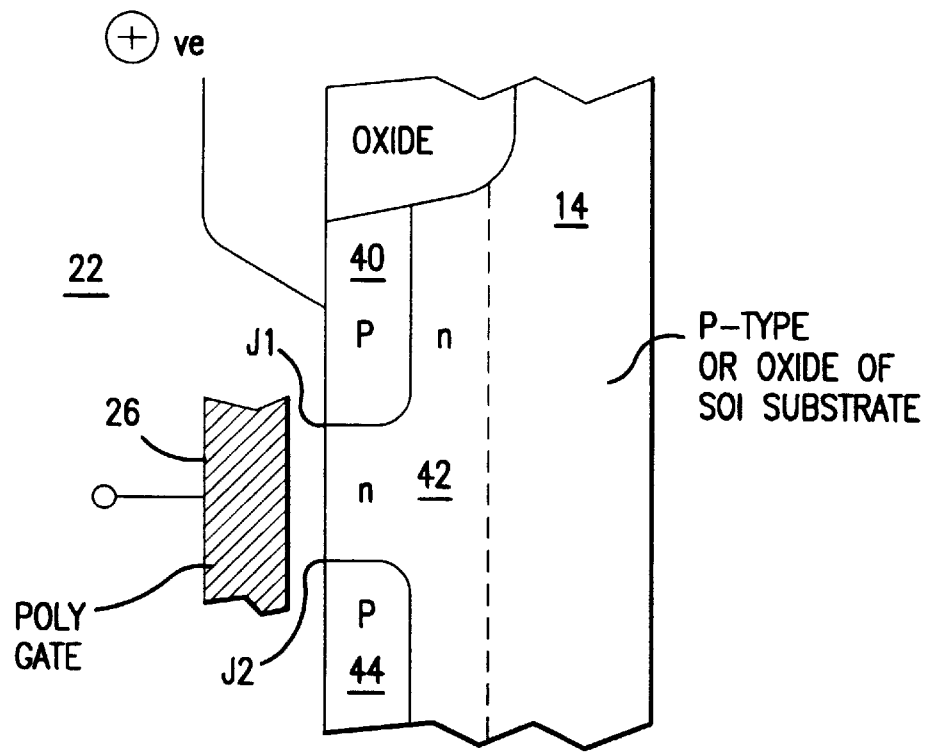
FIG. 4 is a cross-sectional view of the SRAM cell of FIG. 3 taken along the line 4–4 in FIG. 3.
Figure 5:
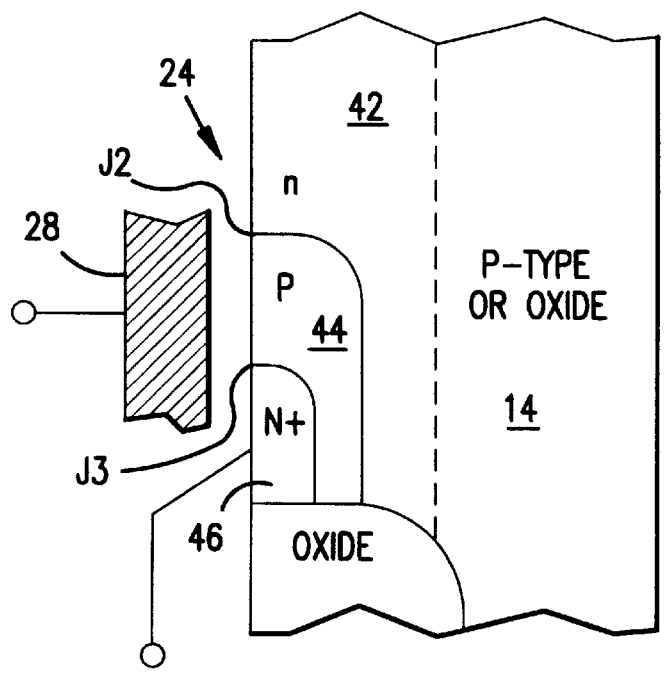
FIG. 5 is a cross-sectional view of the SRAM cell of FIG. 3 taken along the line 5–5 in FIG. 3.

Referring to FIGS. 1, 4 and 5, it can be seen that the gates 26, 28 of the transistors 22, 24 overlie the body of the transistors 22, 24. Gate 26 rests on top of transistor 22 so that it covers the top surface of base n-region 42, and some of the top surface of p+ region 40 and p-region 44. Gate 28 rests on top of transistor 24 so that it covers the top surface of base p-region 44, and some of the top surface of n-region 42 and n+ region 46. The gates 26, 28 are formed of polysilicon and are insulated from each other by a thin oxide layer (not shown).

FIG. 3 provides a schematic view of the dual transistor memory cell 20. The planar structure depicted has an area of approximately 13 $F^2$, a significant improvement over the prior art cells of 50 to 100 $F^2$. The dual transistor memory cell 20 operates as described hereinafter, and can best be understood by referencing FIGS. 6 through 11. Operation of the cell takes advantage of latch-up between the two complementary transistors to construct a compact SRAM cell.

Figure 6:
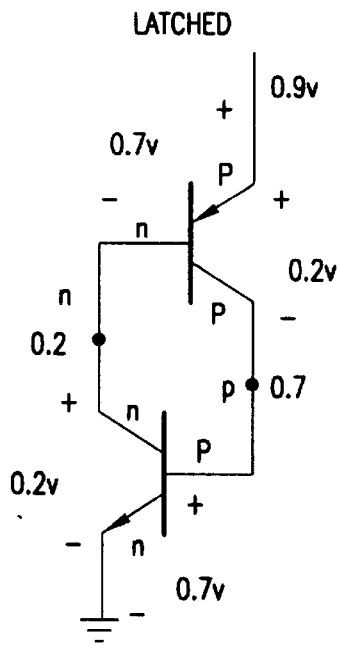
FIG. 6 is a circuit diagram illustrating the latch-up condition in the SRAM cell of FIG. 3.
Figure 7:
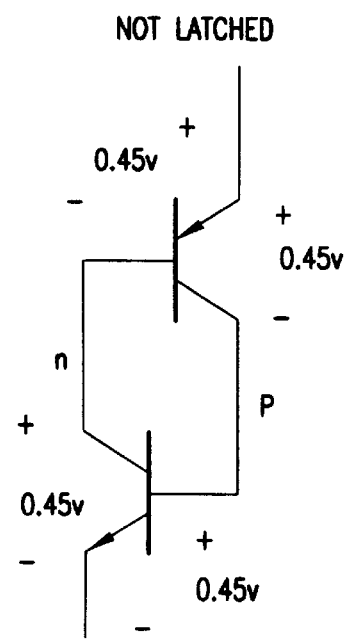
FIG. 7 is a circuit diagram illustrating the blocking condition in the SRAM cell of FIG. 3.

An understanding of the latch-up phenomenon can be reached by careful referencing of the figures in conjunction with the following description. Voltages across the dual transistor memory cell 20 are shown in FIG. 6, depicting the latch-up condition, and FIG. 7, depicting the blocking (non-latched-up) condition. These conditions reflect CMOS latch-up action, initiated by gate voltage from gates 26 and 28. Gates 26 and 28 induce latch-up in the gated lateral bipolar transistor device 12, thus creating one of the two stable states for the static memory cell, as discussed in detail below.

Figure 8:
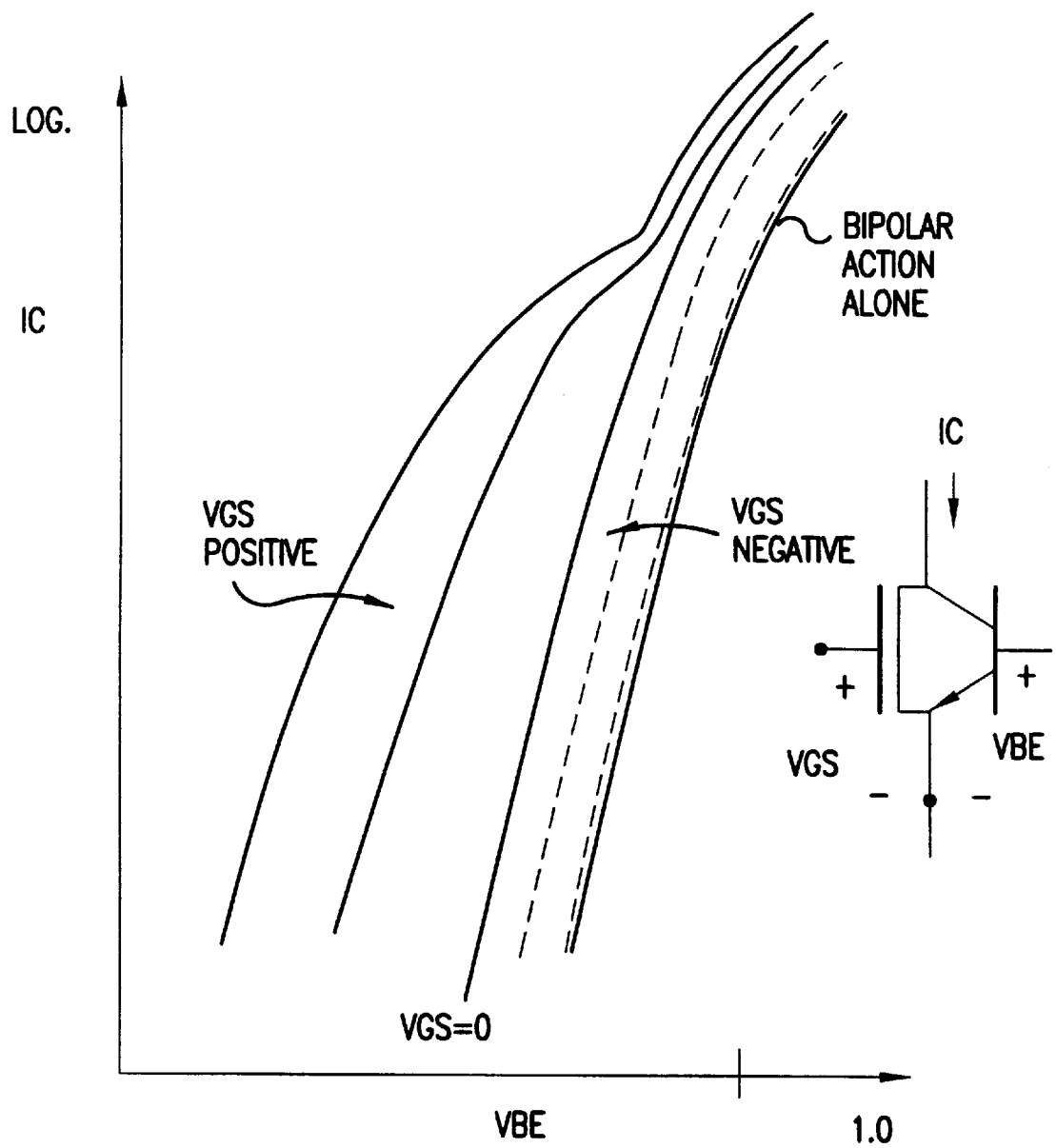
FIG. 8 is a graph illustrating current-voltage characteristics in the gated lateral bipolar transistor structure of the SRAM cell of FIG. 3.
Figure 9:
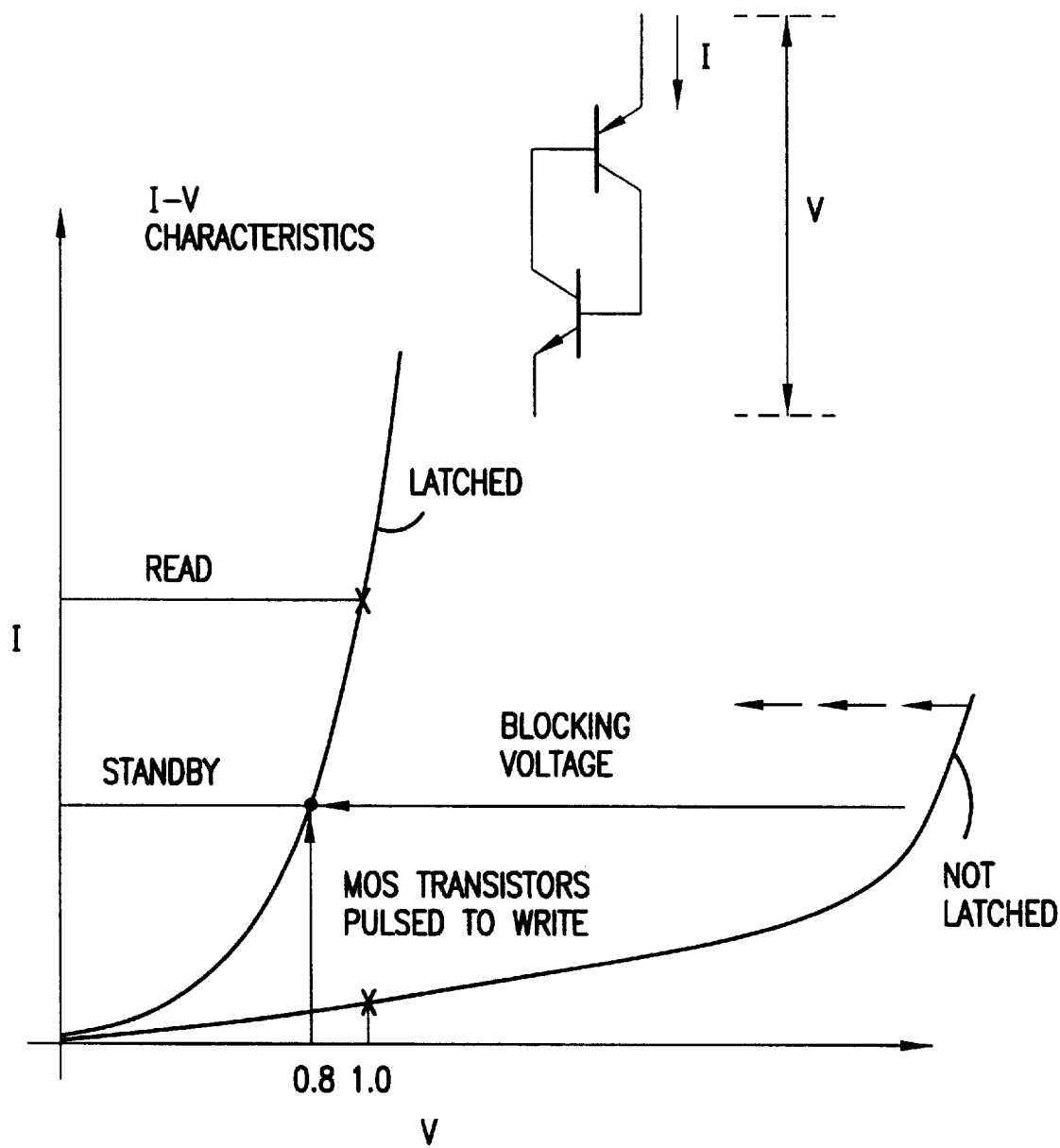
FIG. 9 is a graph depicting the blocking, write and latch-up states of the SRAM cell of FIG. 3.

FIGS. 8 and 9 illustrate gated lateral bipolar transistor characteristics and operation of the static memory cell. As shown in FIG. 8, collector current ($I_C$) is a function of base-emitter voltage ($V_{BE}$) and positive and negative gate-source voltages ($V_{GS}$). Referring to FIG. 9, if the gates of bipolar transistors 22, 24 are biased off, then the cell will block and not become latched-up until the power supply voltage ($V_{DD}$) is increased to about 1.2 to 1.4 volts. However, the cell can be induced to latch-up at low power supply voltages of about 0.9 volts by the application of pulsed gate bias.

Figure 10:
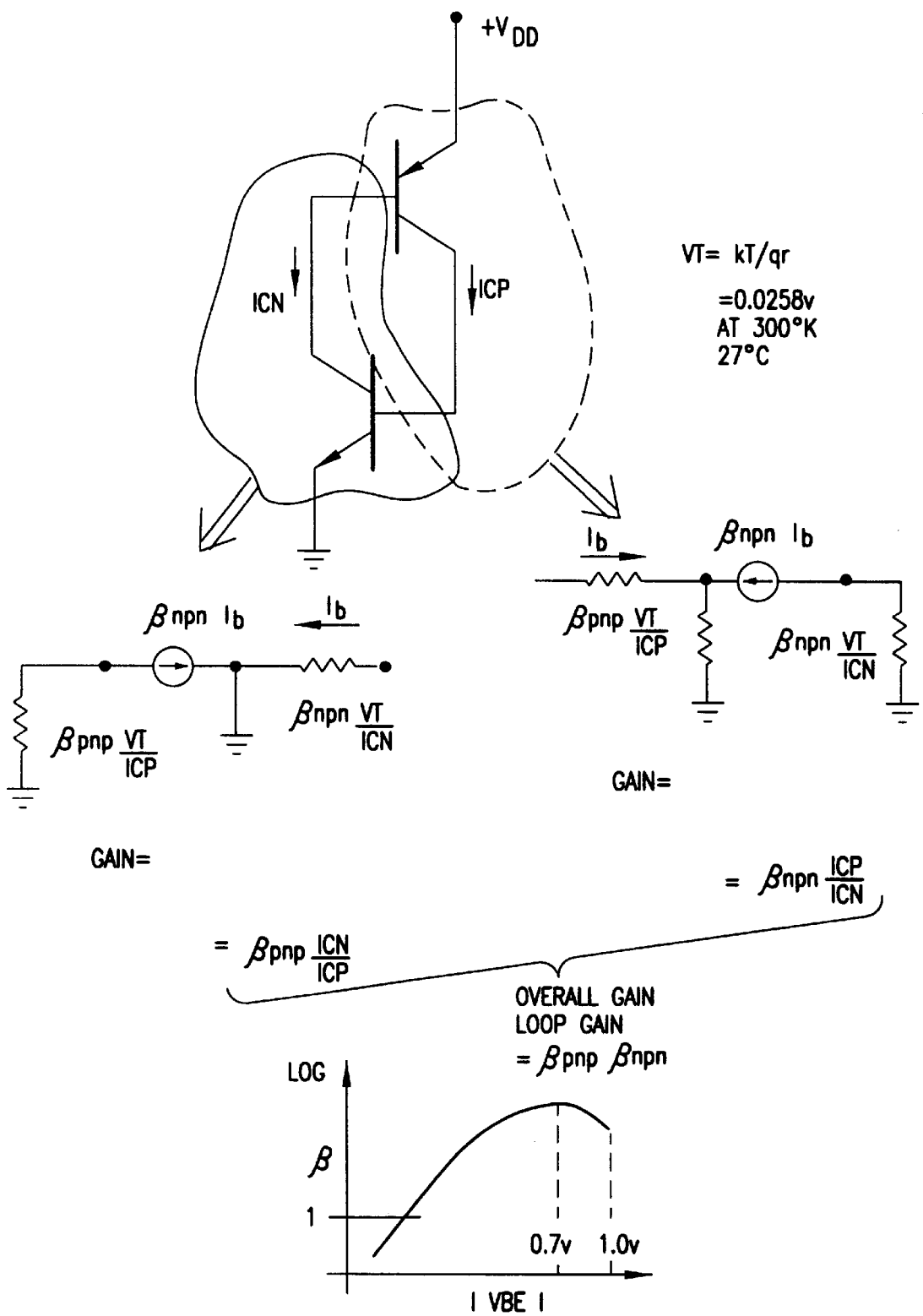
FIG. 10 is a circuit diagram for the SRAM cell of FIG. 3 in the latch-up condition.

FIG. 10 shows the latch-up condition in these CMOS circuits. Under normal conditions, lateral bipolar transistors will not latch-up if the gate voltage is zero or negative for n-channel devices and the drain voltage is low. In order for the circuit to latch-up, the open loop gain must be greater than one. The open loop gain is the product of the transistor common emitter current gains, $\beta_1$ and $\beta_2$, of bipolar transistors 22, 24. At low bias conditions, and low base-emitter voltages ($V_{BE}$), the currents will be low and the bipolar transistors will have a low current gain which can be less than one. As base-emitter voltages ($V_{BE}$) are increased, then collector currents ($I_C$) increase, $\beta$ will increase and the circuit will latch-up when the individual base-emitter voltages ($V_{BE}$) approach about 0.6 to 0.7 volts, or the total power supply voltage is 1.2 to 1.4 volts.

Latch-up can be achieved at low power supply voltages such as 0.9 volts if there is some other stimulus to turn on the transistors. In the memory cell of the present invention, the stimulus is a pulsed gate bias, which decreases the collector-emitter voltages to 0.2 V or less on one transistor causing the base-emitter junctions on the other transistor to become strongly forward-biased, injecting charge into the base. First one transistor is pulsed and then the other. This strongly turns on both transistors causing these transistors to go into the active region of operation with a low collector to emitter voltage. Most of the power supply voltage will appear across the base emitter junctions of the bipolar transistors. The circuit is then latched-up.

Once latched-up, the cell will stay turned on. The bias applied to induce latch-up is "pulsed" in the sense that it is only applied to initiate latch-up. The cell is stable in the latched-up condition as a result of the pulse-initiated latch-up, which occurs during the "write" operation, as discussed below. Because both MOS transistors must be turned on to latch-up the cell, a coincidence in the row and column addresses is required during the write cycle.

An alternative description of the turn-on of these four-region device structures can be given by the consideration of p-n-p-n thyristors. At low currents the center n-p junction J2 is reverse-biased and blocking. To turn on the device, an external stimulus such as a base current must be introduced. Base current can be generated by introducing a pulsed gate bias that turns on the MOS transistors. The pulse level must be calculated to yield sufficient current so that the sum of the common base current gains, $\alpha_1$ and $\alpha_2$, of bipolar transistors 22, 24 exceeds one. Pulsing only one gate will leave one bipolar transistor with a very low current gain, which will not be sufficient to cause regeneration.

Current during the standby latch-up condition can be estimated from consideration of the collector and base current of a gated lateral bipolar transistor as a function of base-emitter voltage ($V_{BE}$). It has been shown that as base-emitter voltage ($V_{BE}$) increases from 0.4 V to 0.5 V, collector current ($I_C$) continues to increase, but base current ($I_B$) is determined by leakage currents until around 0.45 V before increasing at higher voltages. If collector current ($I_C$) is greater than or approximately equal to 0.1 nano-ampere, or if base-emitter voltage ($V_{BE}$) is greater than or approximately equal to 0.45 V, then $\beta$ will be greater than or approximately equal to one. Therefore, a bias voltage of about 0.45 V is sufficient to maintain the circuit in the standby (latched-up) condition. Reset or erase conditions can be achieved by decreasing the bias voltage below 0.45 V for a time sufficient to allow the base charge to recombine.

Figure 11:
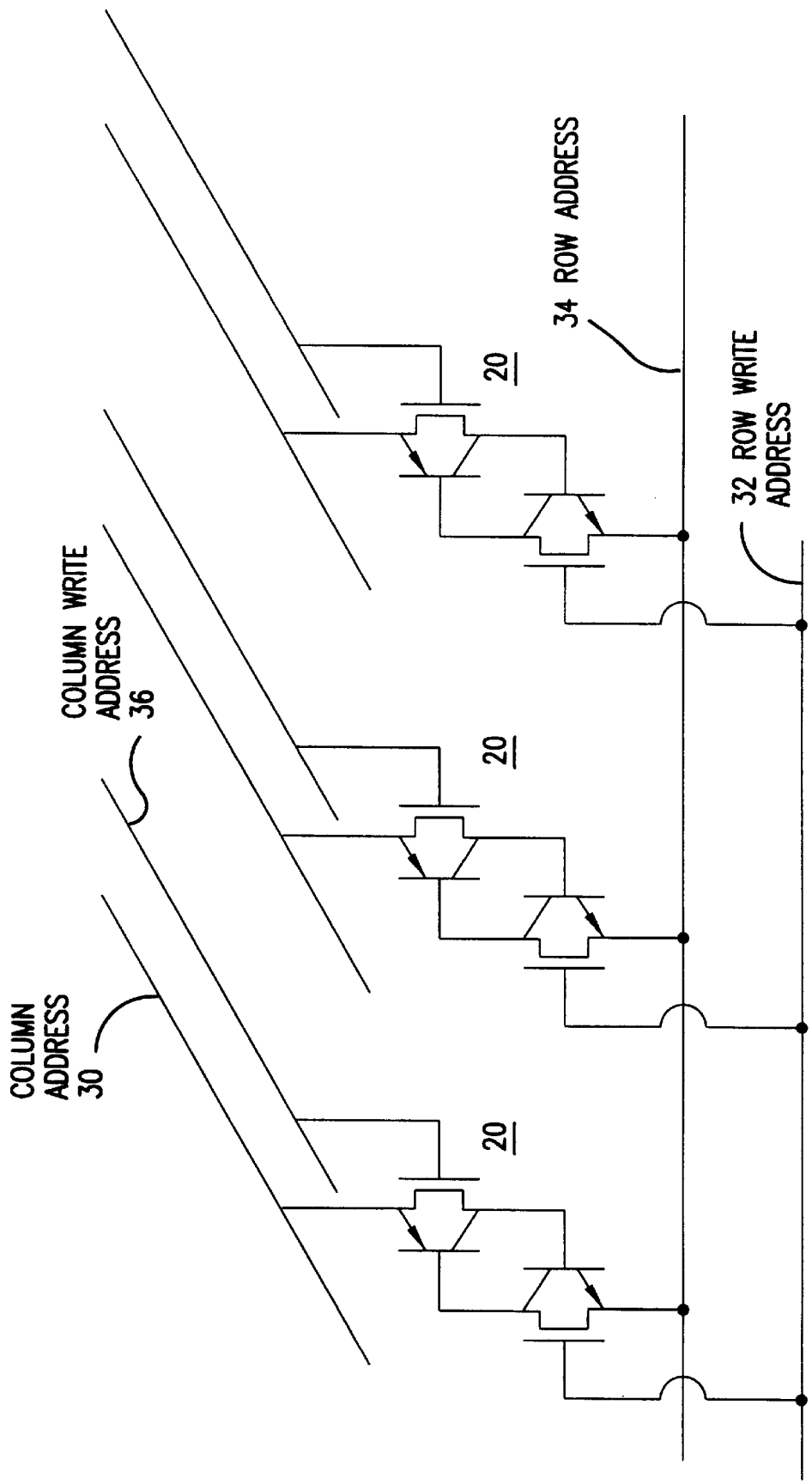
FIG. 11 is a circuit diagram illustrating a SRAM cell array constructed in accordance with the first embodiment of the present invention.

Referring now to FIG. 11, the array structure of the CMOS SRAM includes column decoder 68, row decoder 70, and four lines—column address line 30, gate line 32, row address line 34 and gate line 36. When the cell is not addressed, it is maintained in a low voltage state with $V_{DD}$ around 0.7 V to 0.8 V from the column address line 30 and the row address line 34 to reduce power consumption. Data is read by addressing a row and a column and increasing the power supply voltage across device 20 to 0.9 V or more at the coincidence of the column address line 30 and the row address line 34. If the cell is latched-up, a large current will be sensed between these row and column lines. If not latched-up, there will be little extra current.

Write is accomplished by raising the voltage across the cell at the coincidence of the gate line 32 and 36 address voltages which turns the transistors on strongly. The transistors then latch-up, so that the cell now will be read as storing a "one." The voltage in gate lines 32 and 36 may be immediately lowered once the write operation is completed.

To "erase" or write a "zero" into a cell, the entire row must be erased and rewritten. To do so, the row voltage becomes positive to leave some very low value like 0.4 V or less across all transistors in the row to turn off any transistors which are latched-up. This very low voltage is similar to cutting the power to the row off, and it causes all cells along the row to unlatch, thus "writing" a "zero" into each cell. Sufficient time is then allowed for any excess base charge in the formerly latched-up cells to recombine. Following this, "ones" are written into selected locations along the word line by raising the voltage from gate lines 32 and 36 as described above.

A second embodiment of the present invention involves the interconnection of two memory cells so that they share a common n-region and row address line, as shown in FIGS. 12 and 13. Each parasitic bipolar transistor device 120, 120' comprises two complementary bipolar transistors 122, 124 in connection with two polysilicon gates 126 and 128. Each transistor device 120 is connected to another transistor device 120' via a shared emitter region 146, as can best be seen by reference to FIGS. 12 and 13. Column address lines 30 and 30' are connected to the emitters of transistors 122 and 122', respectively, while row address line 34 is connected to the common emitter of transistors 124 and 124'.

Gate lines 36 and 36' are connected to the gates 126 and 126' of transistors 122 and 122', while gate lines 32 and 32' are connected to the gates 128 and 128' of the transistors 124 and 124'.

As can best be seen in FIG. 14, p+ region 140, n-region 142, and p-region 144 comprise a p-n-p bipolar transistor 122; n+ region 146, p-region 144, and n-region 142 comprise an n-p-n bipolar transistor 124; n+ region 146, p-region 148, and n-region 150 comprise an n-p-n bipolar transistor 124'; and p-region-148, n-region 150, and p+ region 152 comprise a p-n-p bipolar transistor 122'. The transistors 122, 124 are connected so that the collector of transistor 124 is connected to the base of transistor 122, and vice-versa. Transistors 122', 124' are interconnected in a similar fashion. In addition, transistors 124, 124' share the same emitter n+ region 146 that is connected to the row address line 34.

The linked devices 120, 120' function similarly to the single unlinked cell of the first embodiment. The gate lines 32, 32', 36, 36' are still individually connected to each cell, and each of the read and write operations operates at the coincidence of a column and a row. The shared emitter region 146 and shared row address enable the cells to be manufactured in a denser array. In addition, the linked cells may be formed as a silicon-on-insulator (SOI) structure, with a layer of oxide 113 between the device and the underlying substrate 114 serving to isolate the device and permit denser packing of cells. The two interlinked cells 120, 120' have a total area of 22 $F^2$, resulting in a per cell area of 11 $F^2$.

Figure 15:
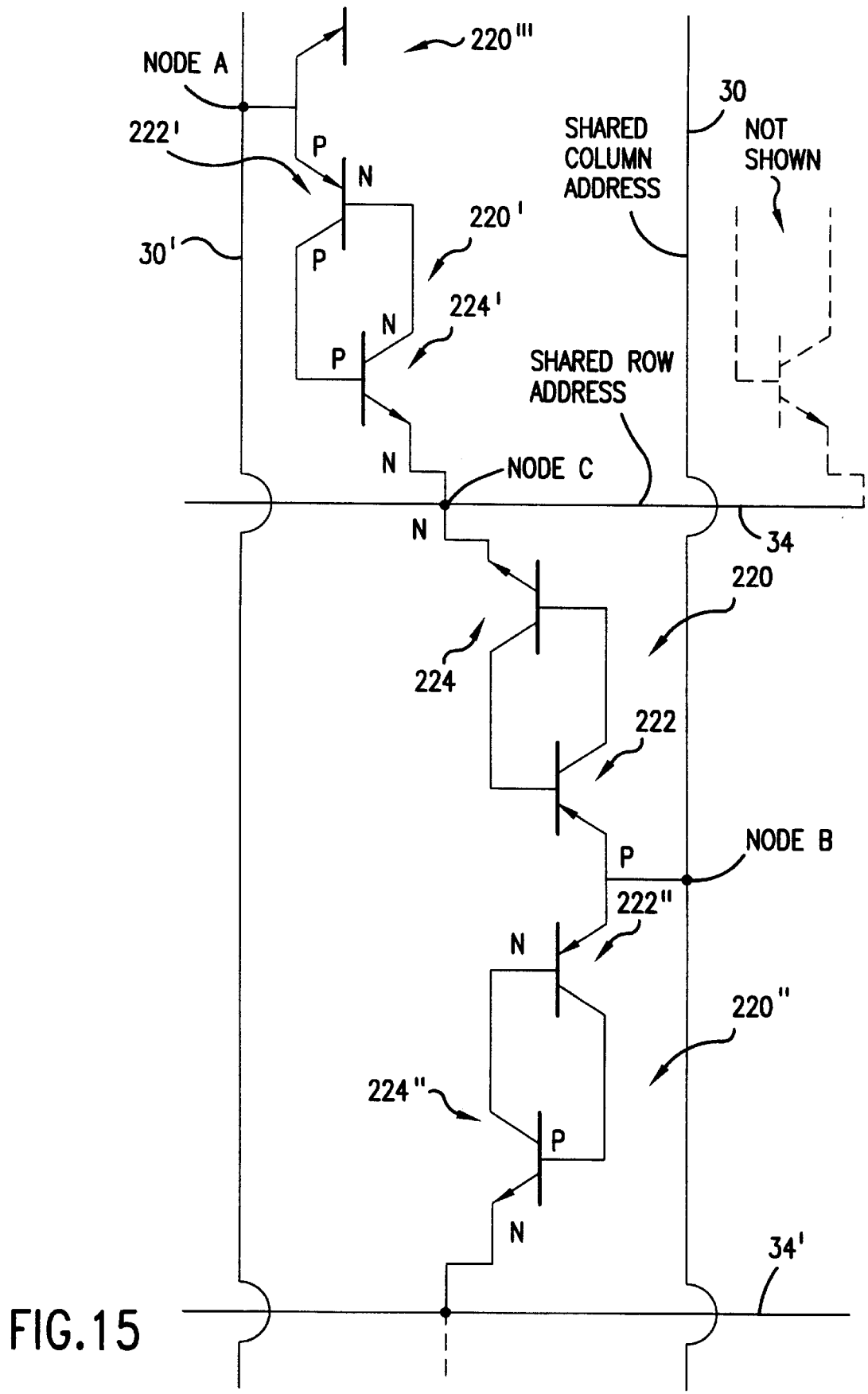
FIG. 15 is a circuit diagram illustrating a third embodiment of a SRAM cell with latch-up and two gated lateral bipolar transistors, and shared row and column address lines, according to the present invention.
Figure 16:
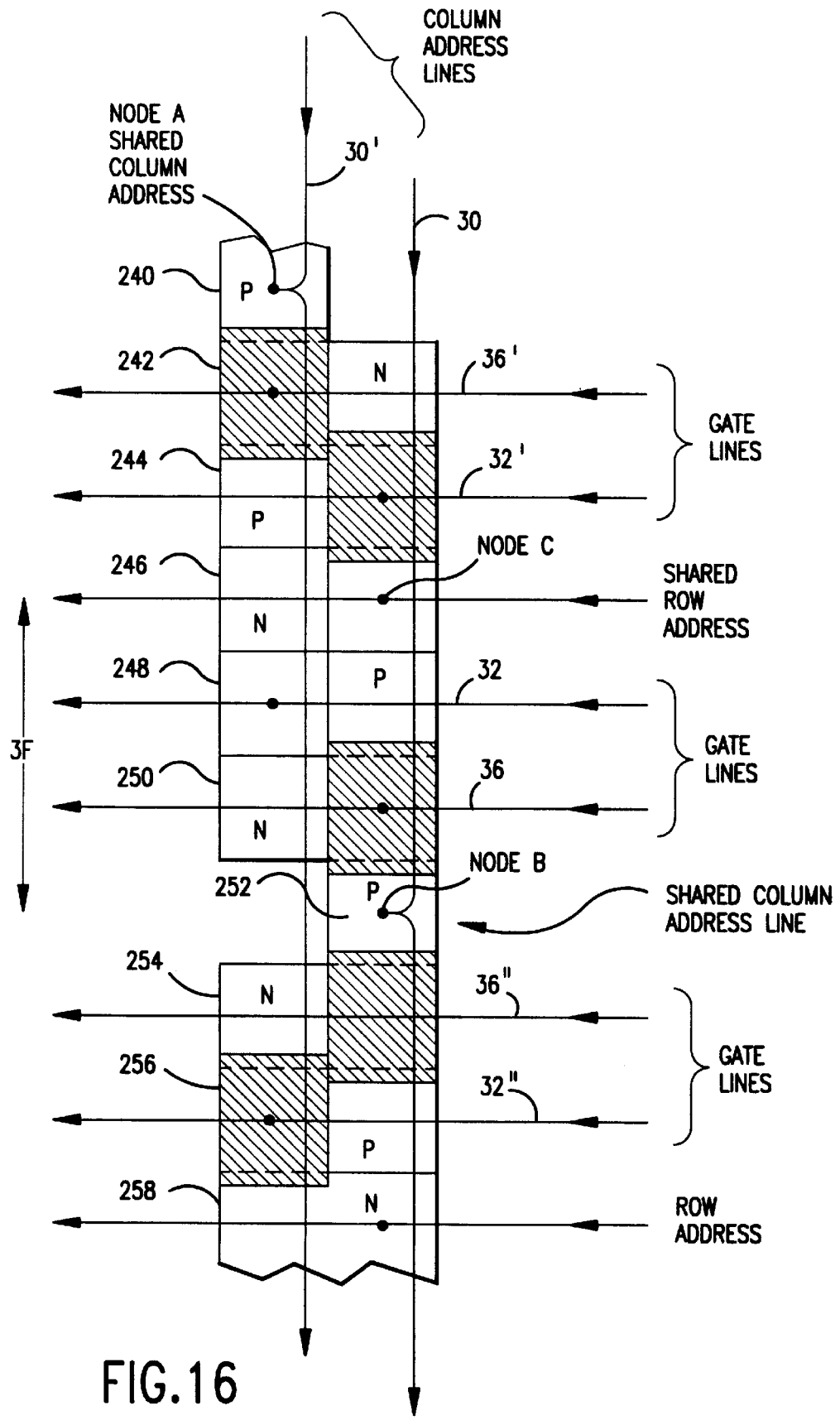
FIG. 16 is a schematic diagram illustrating the regions and features of the SRAM cell of FIG. 15.

A third embodiment of the present invention involves the interconnection of at least three memory cells so that they share common emitter regions, column address lines, and row address lines, as shown in FIGS. 15 and 16. Each parasitic bipolar transistor device 220, 220', 220" comprises two complementary bipolar transistors 222, 224 in connection with two polysilicon gates 226 and 228. The transistor device 220 is connected to another transistor device 220' via a shared emitter n-region 246, and to a third transistor device 220" via a shared emitter p-region 252, as can best be seen by reference to FIGS. 15 and 16.

Column address line 30 is connected to the shared emitter p-region 252 of transistors 222 and 222", while column address line 30' is connected to the emitter p-region 240 of transistor 222'. Gate lines 32, 32' and 32" are connected respectively to the gates 228, 228', and 228" of transistors 224, 224' and 224". Row address line 34 is connected to the shared emitter n-region 246 of transistors 224 and 224', while row address line 34' is connected to the emitter n-region 258 of transistor 224". Gate lines 36, 36' and 36" are connected respectively to the gates 226, 226', and 226" of transistors 222, 222' and 222".

Figure 17:
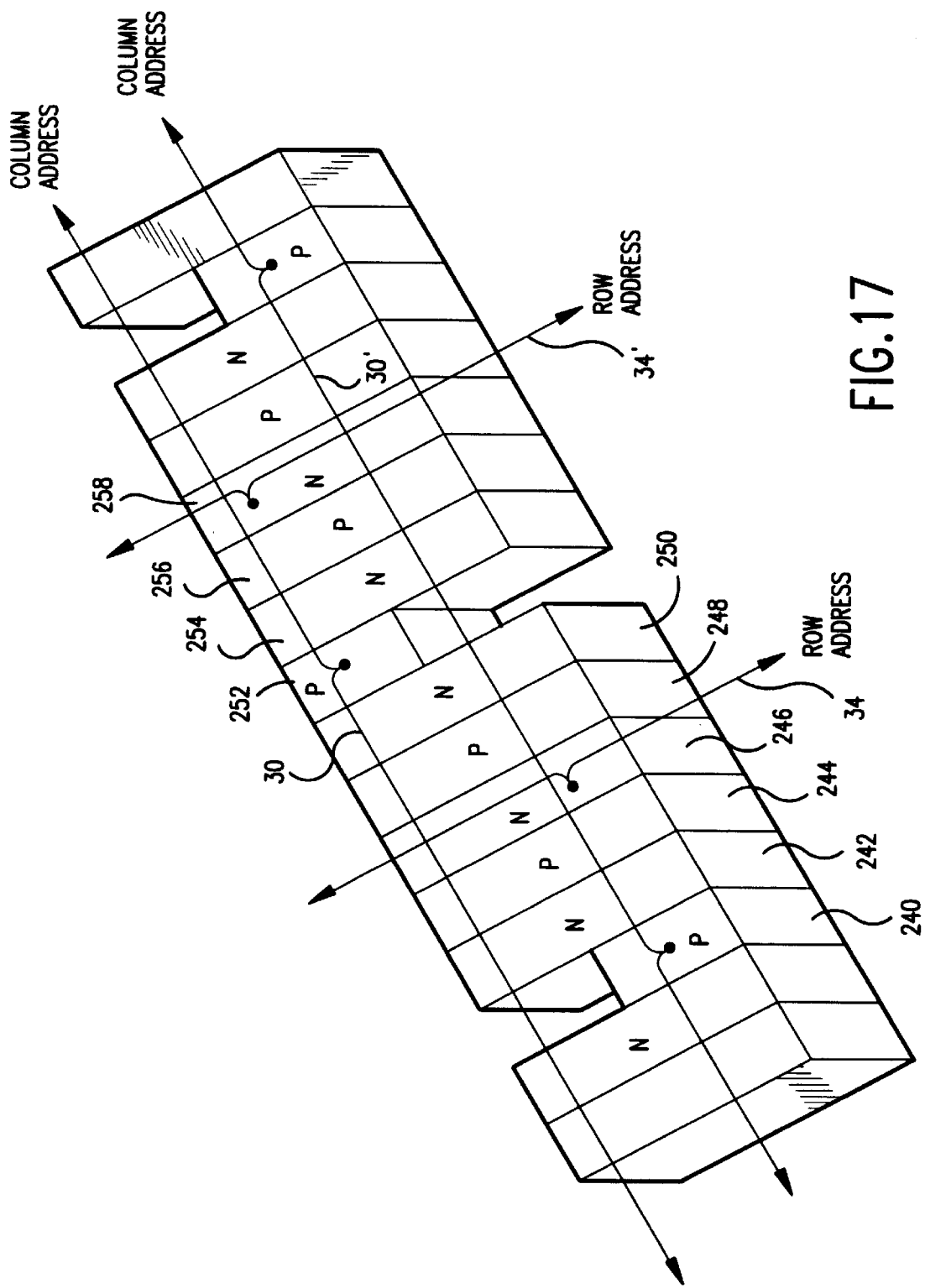
FIG. 17 is a perspective view of the SRAM cell of FIG. 15 illustrating the regions and features.

As can best be seen in FIGS. 16 and 17, p-region 240, n-region 242, and p-region 244 comprise a p-n-p bipolar transistor 222', and n-region 246, p-region 244, and n-region 242 comprise an n-p-n bipolar transistor 224'. N-region 246, p-region 248, and n-region 250 comprise an n-p-n bipolar transistor 224, and p-region 248, n-region 250, and p-region 252 comprise a p-n-p bipolar transistor 222. P-region 252, n-region 254, and p-region 256 comprise a p-n-p bipolar transistor 222", and n-region 254, p-region 256, and n-region 258 comprise an n-p-n bipolar transistor 224".

The transistors 222, 224 are connected so that the collector of transistor 224 is connected to the base of transistor 222, and vice-versa. Transistors 222' and 224', and 222" and 224" are interconnected in a similar fashion. In addition, transistors 224, 224' share the same emitter n-region 246 that is connected to the row address line 34, and transistors 222, 222" share the same emitter p-region 252 that is connected to the column address line 30.

The linked devices 220, 220', 220" function similarly to the single unlinked cell of the first embodiment. The gate lines 32, 32', 32", 36, 36', 36" are still individually connected to each cell, and each of the read and write operations operates at the coincidence of a column and a row. The ability of one cell to share an emitter region 246 and a row address with a second cell, and to share an emitter region 252 and a column address with a third cell enables the cells to be manufactured in a denser array. The compactness of the array results in a per cell area of 9 $F^2$.

The device array 10 of the first embodiment is manufactured through an exemplary process described as follows, resulting in the complete structure shown in FIG. 1. It is to be understood, however, that this process is only one example of many possible processes. For example, although the process as described begins with a p-type substrate, other processes may begin with a silicon-on-insulator (SOI) substrate. Another example is that a CMOS process involving standard twin-well process technology may be used instead of the disclosed process. Variants of the masking and etching processes are also contemplated, as is the use of conventional wells instead of implanted wells. The following description is, therefore, not to be taken in a limiting sense, and the scope of the present invention is defined by the appended claims.

First, a silicon substrate 14 is selected as the base for the device array 10. The silicon substrate 14 may be doped or undoped, but a doped p-type wafer is preferred. Next, a thin oxide layer is grown on top of the silicon substrate by means of thermal oxidation, or other suitable means. A silicon nitride ($Si_3N_4$) ("nitride") layer is then formed, by chemical vapor deposition (CVD) or other deposition means, on top of the oxide layer. A photoresist and mask are applied, and photolithographic techniques are used to define areas to be etched-out. Etching is then carried out to etch through the nitride and oxide layers to expose trenches 16, 18 in which field oxide is to be formed.

The photoresist and mask are then removed, and field oxide is then formed in the exposed trenches 16, 18, by a suitable process such as low-pressure CVD of silicon dioxide or thermal oxidation of the exposed substrate 14. A photoresist and mask are then applied to cover areas not to be doped in the following steps. N-wells are then formed by high-energy ion implantation of arsenic, phosphorus or antimony into the exposed areas. Retrograde doping, where the concentration of n-dopant is highest at the bottom of the well, is achieved by extremely high-energy ion implantation at the MeV level.

The photoresist and mask are then removed, and new photoresist and mask are applied to cover areas that are not to be counter-doped to form p-regions inside the n-wells, such as p-regions 40 and 44 shown in FIG. 1. Ion implantation of boron is then performed to counter-dope the exposed regions and form p-regions. The photoresist and mask are then removed, and new photoresist and mask are applied to cover areas that are not to be counter-doped to form n-regions inside some of the p-regions, such as the n+ region 46 shown in FIG. 1. Ion implantation of arsenic, phosphorus or antimony is then performed to counter-dope the exposed regions and form n-regions 46. The four regions of each device 20 have now been formed, as the formation of the regions 40, 44, and 46 inside the n-well leaves the remaining area of the n-well as region 42 of the device 20.

Gates 26 and 28 are then formed over each device 20. A thin gate oxide layer is formed on top of the junction by a suitable means, and then a polysilicon layer is deposited to serve as a first gate layer. A second gate oxide layer is formed, and then a second polysilicon layer is deposited to serve as a second gate layer. Techniques known in the art of fabricating charge-coupled devices may be used to form the gates 26, 28. Additional masking and etching processes are carried out as necessary to achieve the structural conformation desired. The device array 10 then undergoes a finishing process. Selective etching with hot phosphoric acid or another suitable etchant is performed to remove any remaining masking layers or nitride layers from the top surface of the devices 20. If necessary, planarization by chemical-mechanical polishing or other suitable processes may be performed. Conventional processing methods may then be used to form contact holes and metal wiring to connect the devices. The final structure of the device array 10 is as shown in FIG. 1.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A memory cell, comprising a gated diode having bistable current states for storing information, one of said current states being achieved by operation of gate-induced latch-up of said diode, said gated diode comprising a p-n-p-n four-region diode
    wherein said memory cell is linked to a second memory cell having a gated p-n-p-n diode so that the two p-n-p-n diodes share a common n-region.

2. The memory cell of claim 1 wherein the memory cell is linked to a third memory cell having a gated p-n-p-n diode so that the two p-n-p-n diodes share a common p-region.

3. The memory cell of claim 1 wherein said four-region diode comprises two complementary planar bipolar transistors.

4. The memory cell of claim 1 wherein a first gate of said gated diode is connected to a first and a second junction of said gated diode, and a second gate of said gated diode is connected to the second and a third junction of said gated diode.

5. The memory cell of claim 1 wherein said gate-induced latch-up is achieved by a pulsed gate bias.

6. The memory cell of claim 1 wherein said cell is a static random access memory cell.

7. The memory cell of claim 1 wherein said memory cell has an area of about 13 $F^2$ where F is the minimum lithographic dimension.

8. The memory cell of claim 1 wherein said memory cell has an area of approximately 9 to 11 $F^2$ where F is the minimum lithographic dimension.

9. A circuit for storing information as one of at least two possible stable current states, comprising:
    a multi-region thyristor having at least four regions; and
    at least two gates in contact with a junction of said multi-region thyristor, wherein said gates are connected to a voltage source for producing latch-up in said multi-region thyristor.

10. The circuit of claim 9 wherein said latch-up provides one of the stable current states for storing information in said circuit.

11. The circuit of claim 9 wherein said latch-up is produced by providing negative voltage to said at least two gates.

12. The circuit of claim 9 wherein said latch-up is produced by providing a pulsed bias to said at least two gates.

13. The circuit of claim 9 wherein said multi-region thyristor comprises a seven-region thyristor.

14. The circuit of claim 13 wherein said at least two gates comprise a first gate connected to a first and a second junction of the seven-region thyristor, a second gate connected to the second and a third junction of the seven-region thyristor, a third gate connected to a fourth and a fifth junction of the seven-region thyristor, and a fourth gate connected to the fifth and a sixth junction of the seven-region thyristor.

15. The circuit of claim 14 wherein said circuit comprises two memory cells.

16. The circuit of claim 15 further comprising a shared row address line in connection with a central region of said seven-region thyristor.

17. The circuit of claim 9 further comprising at least two gate lines, each connected to one of said at least two gates.

18. The circuit of claim 9 wherein said multi-region thyristor comprises a ten-region thyristor.

19. The circuit of claim 18 wherein said at least two gates comprise a first gate connected to a first and a second junction of the ten-region thyristor, a second gate connected to the second and a third junction of the ten-region thyristor, a third gate connected to a fourth and a fifth junction of the ten-region thyristor, a fourth gate connected to the fifth and a sixth junction of the ten-region thyristor, a fifth gate connected to a seventh and an eighth junction of said ten-region thyristor, and a sixth gate connected to the eighth and ninth junctions of said ten-region thyristor.

20. The circuit of claim 18 wherein said circuit comprises three memory cells.

21. The circuit of claim 20 further comprising a shared row address line in connection with a fourth region of said ten-region thyristor.

22. The circuit of claim 20 further comprising a shared column address line in connection with a seventh region of said ten-region thyristor.

23. The circuit of claim 20 wherein the circuit is linked to a second circuit having a ten-region thyristor so that the two ten-region thyristors share a common p region and further comprising a shared column address line connected to said common p region.

24. The circuit of claim 23 wherein the circuit is linked to a third circuit having a ten-region thyristor so that the two ten-region thyristors share a common n region and further comprising a shared row address line connected to said common n region.

25. An SRAM array, comprising:
    at least one memory cell having a four-region latch with a first gate in contact with a first and a second junction of said four-region latch, and with a second gate in contact with the second and a third junction of said four-region latch, wherein said gates are connected to a voltage source for producing latch-up in said four-region latch.

26. The SRAM array of claim 25 wherein said latch-up provides one of at least two stable current states for storing information in said at least one memory cell.

27. The SRAM array of claim 25 wherein said latch-up is produced by providing negative voltage to at least one of said gates.

28. The SRAM array of claim 25 wherein said latch-up is produced by providing a pulsed bias to at least one of said gates.

29. The SRAM array of claim 25 wherein said four-region latch comprises two complementary planar bipolar transistors.

30. The SRAM array of claim 25 further comprising two gate lines, each connected to one of said gates.

31. The SRAM array of claim 25 wherein said at least one memory cell comprises two memory cells, and wherein the four-region latches of said memory cells overlap to share a common n region, and further comprising a shared row address line connected to said common n region.

32. The SRAM array of claim 25 wherein said at least one memory cell comprises at least three memory cells, and wherein the four-region latches of a first and a second memory cell overlap to share a common n region, and further comprising a shared row address line connected to said common n region, and wherein the four-region latches of the first and a third memory cell overlap to share a common p region, and further comprising a shared column address line connected to said common p region.

33. An SRAM array, comprising:

a substrate;

a plurality of planar four-region transistors each having two gates; and gate lines connecting the gates to a voltage source for producing latch-up in said four-region transistors.

34. The SRAM array of claim 33 wherein said latch-up provides one of the stable current states for storing information in said planar four-region transistors.

35. The SRAM array of claim 33 further comprising an insulating material layer between each of said transistors and the substrate, horizontally isolating the transistors.

36. The SRAM array of claim 35 wherein said insulating material is an oxide.

37. A processor based system, comprising a processor; and a memory circuit connected to the processor, the memory circuit containing at least one memory cell comprising a gated four region diode having bistable current states for storing information, one of said current states being achieved by operation of gate-induced latch-up of said four diode region, said at least one memory cell being linked to another memory cell comprising a gated four-region diode so that the two-four-region diodes share a common region.

38. The processor based system of claim 37 wherein the four-region diode is a p-n-p-n diode.

39. The processor based system of claim 37 wherein three memory cells of said at least one memory cell are linked so that a first four-region diode shares a first common region with a second four-region diode and a second common region with a third four-region diode.

40. The processor based system of claim 37 wherein said gated four-region diode comprises two complementary bipolar transistors.

41. The processor based system of claim 37 wherein said gate-induced latch-up is achieved by a pulsed gate bias.

42. The processor based system of claim 37 wherein said at least one memory cell is a static random access memory cell.

43. The processor based system of claim 37 wherein said at least one memory cell has an area of approximately 9 to 13 $F^2$ where F is the minimum lithographic dimension.

44. A method of forming a circuit for storing information as one of at least two possible stable current states, the method comprising the following steps:

providing a semiconductor substrate;

providing doped silicon regions to form a multi-region planar thyristor having at least four regions;

forming at least two polysilicon gates in connection with at least two separate junctions of said multi-region planar thyristor; and connecting said at least two polysilicon gates to a voltage source for producing latch-up in said multi-region planar thyristor.

45. The method of claim 44 wherein said step of providing doped silicon regions further comprises forming one memory cell.

46. The method of claim 44 wherein said step of providing doped silicon regions further comprises forming a seven-region planar thyristor.

47. The method of claim 46 wherein said step of providing doped silicon regions further comprises forming two memory cells.

48. The method of claim 47 further comprising connecting a central region of said seven-region planar thyristor to a shared row address line.

49. The method of claim 44 wherein said step of providing doped silicon regions further comprises forming a ten-region planar thyristor.

50. The method of claim 49 wherein said step of providing doped silicon regions further comprises forming three memory cells.

51. The method of claim 50 further comprising connecting a first region of said ten region planar thyristor to a shared row address line, and a second region of said ten-region planar thyristor to a shared column address line.

* * * * *